United States Patent
Wu et al.

(10) Patent No.: US 10,483,999 B1
(45) Date of Patent: *Nov. 19, 2019

(54) LOOP CONSISTENCY USING MULTIPLE CHANNEL ESTIMATES

(71) Applicant: Seagate Technology LLC, Cupertino, CA (US)

(72) Inventors: Zheng Wu, San Jose, CA (US); Jason Vincent Bellorado, San Jose, CA (US); Marcus Marrow, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/997,571

(22) Filed: Jun. 4, 2018

Related U.S. Application Data (63) Continuation of application No. 15/436,709, filed on Feb. 17, 2017, now Pat. No. 9,998,136.

(51) Int. Cl.
  *H03M 1/18* (2006.01)
  *H03M 1/12* (2006.01)
  *G11B 20/10* (2006.01)

(52) U.S. Cl.
  CPC ......... *H03M 1/18* (2013.01); *G11B 20/10027* (2013.01); *G11B 20/10037* (2013.01); *G11B 20/10222* (2013.01); *H03M 1/124* (2013.01); *H03M 1/183* (2013.01); *H03M 1/12* (2013.01)

(58) Field of Classification Search
  None
  See application file for complete search history.

(56) References Cited

U.S. PATENT DOCUMENTS

| | | |
|---|---|---|
| 5,563,746 A | 10/1996 | Bliss |
| 5,726,818 A | 3/1998 | Reed et al. |
| 5,754,352 A | 5/1998 | Behrens et al. |
| 5,793,548 A | 8/1998 | Zook |
| 5,822,142 A | 10/1998 | Hicken |
| 5,909,332 A | 6/1999 | Spurbeck et al. |
| 5,954,837 A | 9/1999 | Kim |
| 6,069,758 A | 5/2000 | Chung |
| 6,172,836 B1 | 1/2001 | Bang |
| 6,275,346 B1 | 8/2001 | Kim et al. |
| 6,307,696 B1 | 10/2001 | Bishop et al. |
| 6,353,649 B1 | 3/2002 | Bockleman et al. |
| 6,480,349 B1 | 11/2002 | Kim et al. |
| 6,594,094 B2 | 7/2003 | Rae et al. |
| 6,594,098 B1 * | 7/2003 | Sutardja ........... G11B 20/10009 360/46 |
| 6,760,185 B1 | 7/2004 | Roth et al. |
| 6,973,150 B1 | 12/2005 | Thuringer |
| 6,996,193 B2 | 2/2006 | Yamagata et al. |
| 7,035,029 B2 | 4/2006 | Sawada et al. |

(Continued)

*Primary Examiner* — Howard Williams
(74) *Attorney, Agent, or Firm* — Setter Roche LLP; Kirk A. Cesari (57) ABSTRACT

An apparatus may include a circuit configured to generate, by an analog to digital converter (ADC), one or more ADC samples based on an input signal. The circuit may be further configured to generate a first estimated signal using a first channel pulse response estimation with a gain constraint based on the one or more ADC samples and generate a second estimated signal using a second channel pulse response estimation with a phase constraint based on the one or more ADC samples.

20 Claims, 7 Drawing Sheets

(56) References Cited

U.S. PATENT DOCUMENTS

| | | |
|---|---|---|
| 7,068,461 B1 | 6/2006 | Chue et al. |
| 7,199,956 B1 | 4/2007 | Moser et al. |
| 7,602,568 B1 | 10/2009 | Katchmart |
| 7,643,548 B2 | 1/2010 | Hafeez |
| 7,665,007 B2 | 2/2010 | Yang et al. |
| 7,738,538 B1 | 6/2010 | Tung |
| 7,917,563 B1 | 3/2011 | Shih et al. |
| 7,995,691 B2 | 8/2011 | Yang |
| 7,997,582 B2 | 8/2011 | Wong |
| 8,077,571 B1 | 12/2011 | Xia et al. |
| 8,139,305 B2 | 3/2012 | Mathew et al. |
| 8,266,505 B2 | 9/2012 | Liu et al. |
| 8,400,726 B1 | 3/2013 | Wu et al. |
| 8,516,347 B1 | 8/2013 | Li et al. |
| 8,625,216 B2 | 1/2014 | Zhang et al. |
| 9,043,688 B1 | 5/2015 | Chan et al. |
| 9,077,501 B1 | 7/2015 | Oberg et al. |
| 9,129,646 B2 | 9/2015 | Mathew et al. |
| 9,178,625 B1 | 11/2015 | Hueda et al. |
| 9,236,952 B2 | 1/2016 | Sun et al. |
| 9,362,933 B1 | 6/2016 | Chaichanavong |
| 9,613,652 B2 | 4/2017 | Link et al. |
| 2002/0094048 A1 | 7/2002 | Simmons et al. |
| 2003/0026016 A1 | 2/2003 | Heydari et al. |
| 2003/0048562 A1 | 3/2003 | Heydari et al. |
| 2003/0185291 A1 | 10/2003 | Nakahira et al. |
| 2004/0047403 A1 | 3/2004 | Choi et al. |
| 2007/0002890 A1 | 1/2007 | Mangold et al. |
| 2007/0018733 A1 | 1/2007 | Wang et al. |
| 2007/0205833 A1 | 9/2007 | Mar et al. |
| 2008/0292029 A1 | 11/2008 | Koslov |
| 2009/0268857 A1 | 10/2009 | Chen et al. |
| 2010/0138722 A1 | 6/2010 | Harley et al. |
| 2010/0211830 A1 | 8/2010 | Sankaranarayanan et al. |
| 2010/0272150 A1 | 10/2010 | Kil et al. |
| 2011/0072330 A1 | 3/2011 | Kolze |
| 2011/0158359 A1 | 6/2011 | Khayrallah et al. |
| 2013/0182347 A1 | 7/2013 | Maeto |
| 2013/0339827 A1 | 12/2013 | Han et al. |
| 2014/0337676 A1 | 11/2014 | Yen et al. |
| 2014/0355147 A1 | 12/2014 | Cideciyan et al. |
| 2015/0124912 A1 | 5/2015 | Eliaz et al. |
| 2015/0179213 A1 | 6/2015 | Liao et al. |
| 2015/0189574 A1 | 7/2015 | Ng et al. |
| 2016/0055882 A1 | 2/2016 | Cideciyan et al. |
| 2016/0134449 A1 | 5/2016 | Liu et al. |
| 2016/0156493 A1 | 6/2016 | Bae et al. |
| 2016/0270058 A1 | 9/2016 | Furuskog et al. |
| 2016/0293205 A1 | 10/2016 | Jury et al. |
| 2017/0162224 A1 | 6/2017 | Mathew et al. |

\* cited by examiner

LOOP CONSISTENCY USING MULTIPLE CHANNEL ESTIMATES

CROSS-REFERENCE TO RELATED APPLICATIONS

This application is a continuation of and claims priority to co-pending U.S. patent application Ser. No. 15/436,709, entitled "LOOP CONSISTENCY USING MULTIPLE CHANNEL ESTIMATES", which was filed Feb. 17, 2017, the contents of which is incorporated herein by reference in its entirety.

SUMMARY

In certain embodiments, an apparatus may include a circuit configured to generate, by an analog to digital converter (ADC), one or more ADC samples based on an input signal. The circuit may be further configured to generate a first estimated signal using a first channel pulse response estimation with a gain constraint based on the one or more ADC samples and generate a second estimated signal using a second channel pulse response estimation with a phase constraint based on the one or more ADC samples.

In certain embodiments, a system may comprise an ADC circuit configured to generate one or more ADC samples based on an input signal. The system may also include a first channel pulse response estimate circuit configured to generate a first estimated signal using a first channel pulse response estimation with a gain constraint based on the one or more ADC samples. Moreover, the system may include a second channel pulse response estimate circuit configured to generate a second estimated signal using a second channel pulse response estimation with a phase constraint based on the one or more ADC samples.

In certain embodiments, a method may include generating, by an analog to digital converter (ADC), one or more ADC samples based on an input signal. The method may further include generating a first estimated signal using a first channel pulse response estimation with a gain constraint based on the one or more ADC samples and generating a second estimated signal using a second channel pulse response estimation with a phase constraint based on the one or more ADC samples. In addition, the method may include, during a preamble portion of the input signal, determining a gain control parameter for a variable gain amplifier (VGA) generating the input signal based on the second estimated signal.

DETAILED DESCRIPTION

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with another embodiment, the methods and functions described herein may be implemented as one or more software programs running on a computing device, such as a personal computer that is using a disc drive. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or device including instructions that when executed cause a processor to perform the methods.

The present disclosure generally relates to adjusting an amplitude and phase of a signal being input to an analog to digital converter, for example, of a read channel. In some example embodiments, the adjustment of the amplitude and phase of the signal may be performed based on multiple channel pulse response estimations, for example, with different constraints.

In some recording systems according to this disclosure, a signal read from a disk may be first amplified by a pre-amplifier. The signal then may pass through an analog front end (AFE) before it is sampled by an analog-to-digital converter (ADC). The AFE may include a variable-gain amplifier (VGA) that may scale the signal range at the input of the ADC, for example, to effectively utilize the full range of the ADC. In some cases, if the input of the ADC is not scaled to the signal range of the ADC, quantization, noise, and saturation of the output of the ADC may severely degrade the performance of the system. Similarly, a phase interpolator of a sampling clock of the ADC may be utilized to adjust the sampling by the ADC to better detect the signal read from a disk.

In some magnetic recording systems, the information stored in a sector of a disk may include an acquisition portion and a user data portion. In some embodiments, the acquisition portion is a preamble. The preamble may precede the user data portion, and the preamble's data pattern may be known. For example, the preamble may comprise repetitions of the bit pattern [+1+1 −1 −1].

Some systems may have an acquisition gain-loop to adjust the VGA gain during the preamble and a tracking gain-loop to adjust the VGA gain during the user data portion of the sector. The acquisition gain-loop may adjust the VGA gain such that the amplitude at the input of the ADC converges to a targeted value (e.g., an acquisition target amplitude $A_T$) and the tracking gain-loop may adjust the VGA gain to enable the signal at the input of the ADC to maximize the utilization of the range of the ADC.

Similarly, some systems may have an acquisition timing-loop to adjust the sampling clock phase during the preamble and a tracking timing-loop to adjust the sampling clock phase during the user data portion of the sector. The acquisition timing-loop may adjust the sampling clock phase of the ADC such that the sampling clock phase of the ADC converges to a targeted value (e.g., an acquisition target phase $\theta_T$) and the tracking timing-loop may adjust the sampling clock phase such that the sampling clock phase does not drift during the user data.

In some embodiments, the acquisition-tracking system may utilize channel response estimates with, for example, different constraints. In particular, in some examples, the acquisition gain-loop, the acquisition timing-loop and the tracking timing-loop may utilize a channel response estimate with a phase constraint but without an amplitude or gain constraint. In some such examples, the tracking gain-loop may utilize a channel response estimate with an amplitude or gain constraint but without a phase constraint. In other examples, the acquisition gain-loop may utilize a channel response estimate without either gain constraint or phase constraint, the acquisition timing-loop and the tracking timing-loop may utilize a channel response estimate with a phase constraint but without a gain constraint, and the tracking gain-loop may utilize a channel response estimate with a gain constraint but without a phase constraint. Other variations are possible.

Figure 1:
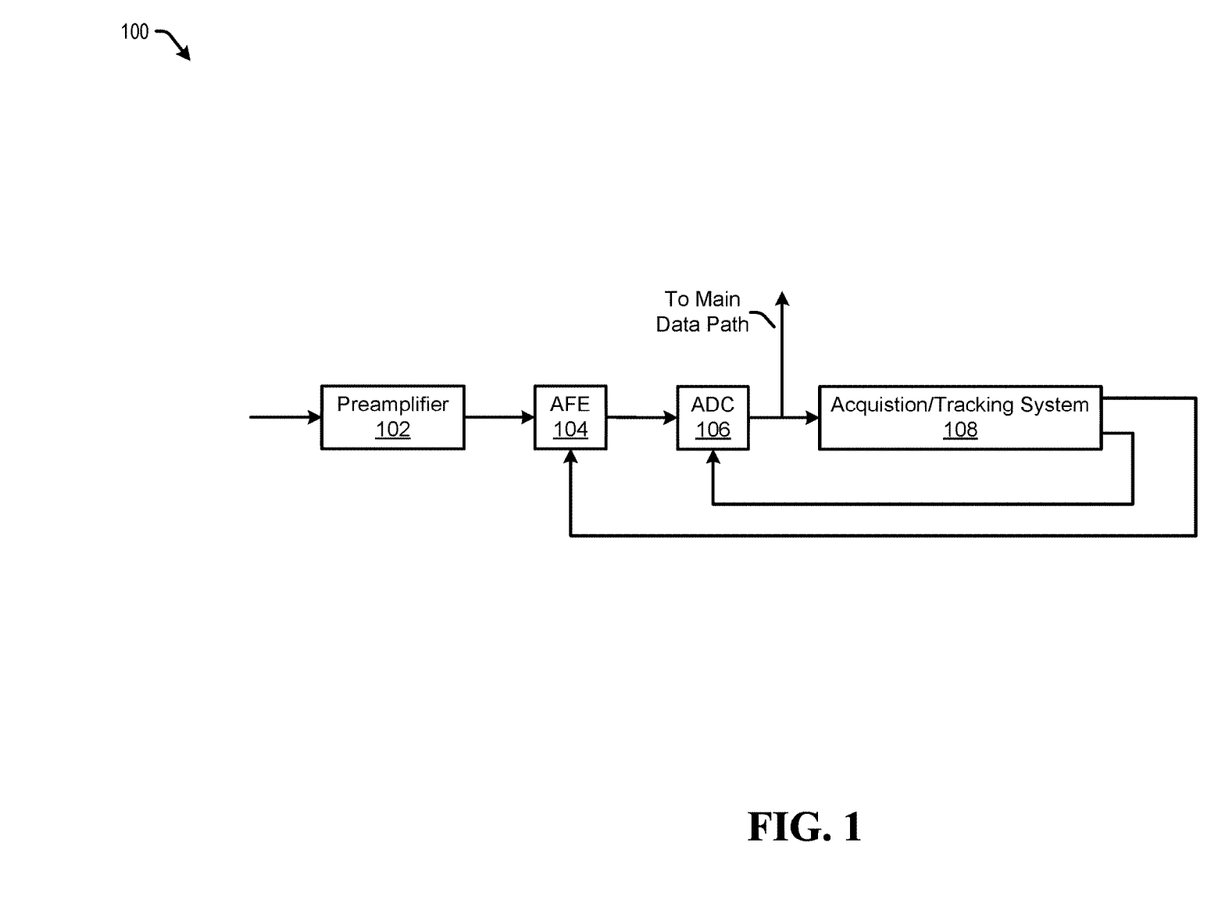
FIG. 1 is a block diagram of a recording system, in accordance with certain embodiments of the present disclosure.

FIG. 1 is a block diagram illustrating an embodiment of a recording system 100. As shown, a pre-amplifier 102 may first amplify a signal read from a disk. An analog front end (AFE) 104 may process the amplified signal and may output the resulting signal to an ADC 106. The ADC 106 may then sample the signal output by the AFE 104 and output the result to a main data path and to an acquisition/tracking system 108. Because ADC 106 may have a limited dynamic range, AFE 104 may include a variable-gain amplifier (VGA) that may scale the signal range at the input of ADC 106. In some examples, the AFE 104 may operate to effectively utilize the full range of ADC 106 which may provide improved signal resolution because underutilization of the dynamic range of the ADC may result in quantization, noise, and saturation of the output of ADC 106 which may degrade the performance of the system. Similarly, the AFE 104 or ADC 106 may include a phase interpolator that may adjust a sampling clock of the ADC to adjust the sampling by the ADC to better detect the signal read from a disk. In some examples, the acquisition/tracking system 108 may operate to control the adjustment by the VGA and the phase interpolator to compensate for variation in the signal read from the disk.

In the example shown, the system 100 may read data from storage media (e.g., Flash storage or magnetic disk storage). In some other embodiments, the techniques described herein may be used in a communications system and may be implemented in a wired or wireless transmitter and/or receiver.

Figure 2:
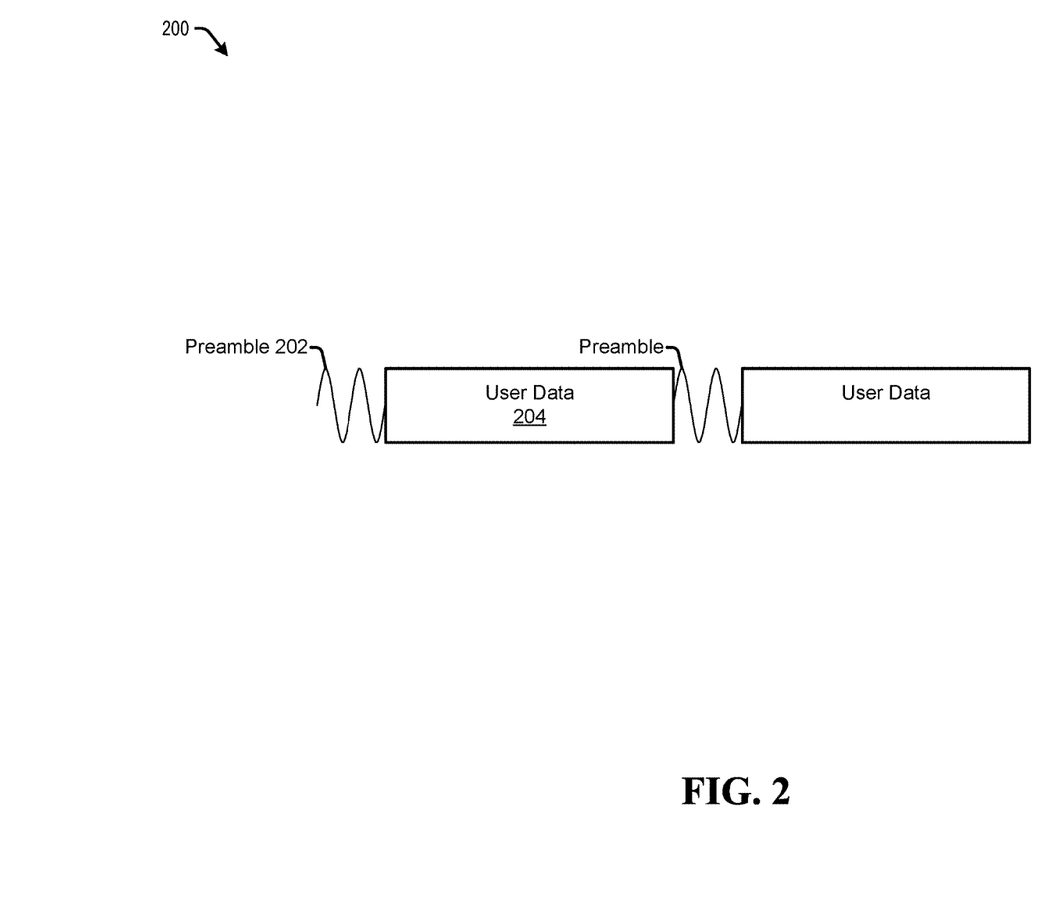
FIG. 2 is a diagram illustrating a signal read from a plurality of sectors, in accordance with certain embodiments of the present disclosure.

FIG. 2 is a diagram illustrating a signal read from a plurality of sectors, for example, on a magnetic disk. In some magnetic recording systems, a sector may be a sub-division of a track on a magnetic disk. In some magnetic recording systems, the information stored in a sector of a disk may include an acquisition portion and a user data portion. In some embodiments, the acquisition portion may be a preamble. Each sector may have a preamble sequence 202 (hereinafter referred to as a preamble), followed by recorded user data 204 (hereinafter referred to as the user data). In some embodiments, preamble 202 may be 84 bits long and user data 204 may be 32K bits long. Preamble 202 may be a sequence with a known data pattern. In some embodiments, preamble 202 may include a repetition of the pattern [+1+1 −1 −1]. Because of inter-symbol interference (ISI) within the signal, the preamble waveform may be approximately a sine-wave, as shown in FIG. 2.

In some embodiments, the preamble 202 and the user data 204 are used to adjust the VGA gain and to synchronize the sampling phase of the ADC.

Herein, an automatic gain control (AGC) circuit for adjusting the VGA gain during preamble 202 may be referred to as an acquisition gain-loop, while the AGC circuit for adjusting the VGA gain during user data portion 204 may be referred to as a tracking gain-loop. Similarly, a phase control circuit for adjusting the sampling phase of the ADC during preamble 202 may be referred to as an acquisition timing-loop, while the phase control circuit for adjusting the sampling phase of the ADC during user data portion 204 may be referred to as a tracking timing-loop.

The acquisition gain-loop may adjust the VGA gain during preamble 202 such that the preamble amplitude at the input of ADC 106 may converge to an amplitude target $A_T$, while the tracking gain-loop may adjust the VGA gain such that the signal range at the input of ADC 106 may effectively utilize the full range of ADC 106. As mentioned above, the preamble 202 may be a known data pattern and, as such, the acquisition gain-loop may operate without risk of erroneous adjustment (e.g. from an erroneous decision by a detector). However, because the length of preamble 202 may not be very long, and because received signal range variation may arise in the middle of a user data portion 204 which cannot be compensated for by the acquisition gain-loop, a tracking gain-loop may be used to adjust the VGA gain during user data portion 204 as well.

The acquisition timing-loop may adjust the sampling phase of the ADC during preamble 202 such that the sampling of the preamble at the ADC 106 may converge to a preamble phase target $\theta_T$, while the tracking timing-loop may adjust the sampling phase of the ADC such that the sampling phase of the user data portion 204 by the ADC 106 does not drift. Some embodiments may include the tracking timing-loop for similar reasons to those discussed above for the tracking gain-loop.

In some examples, different algorithms may be used during acquisition and tracking for adjustments of the ADC parameters, for example, because of different data patterns and assumptions. As such, in some examples, the system may be configured to provide converged values for acquisition and tracking that may be close or equivalent such that the transient period from acquisition to tracking may be reduced. Some embodiments may be configured to use multiple channel pulse response estimates with different constraints which may provide improved loop consistency between the two stages of the loops.

Figure 3:
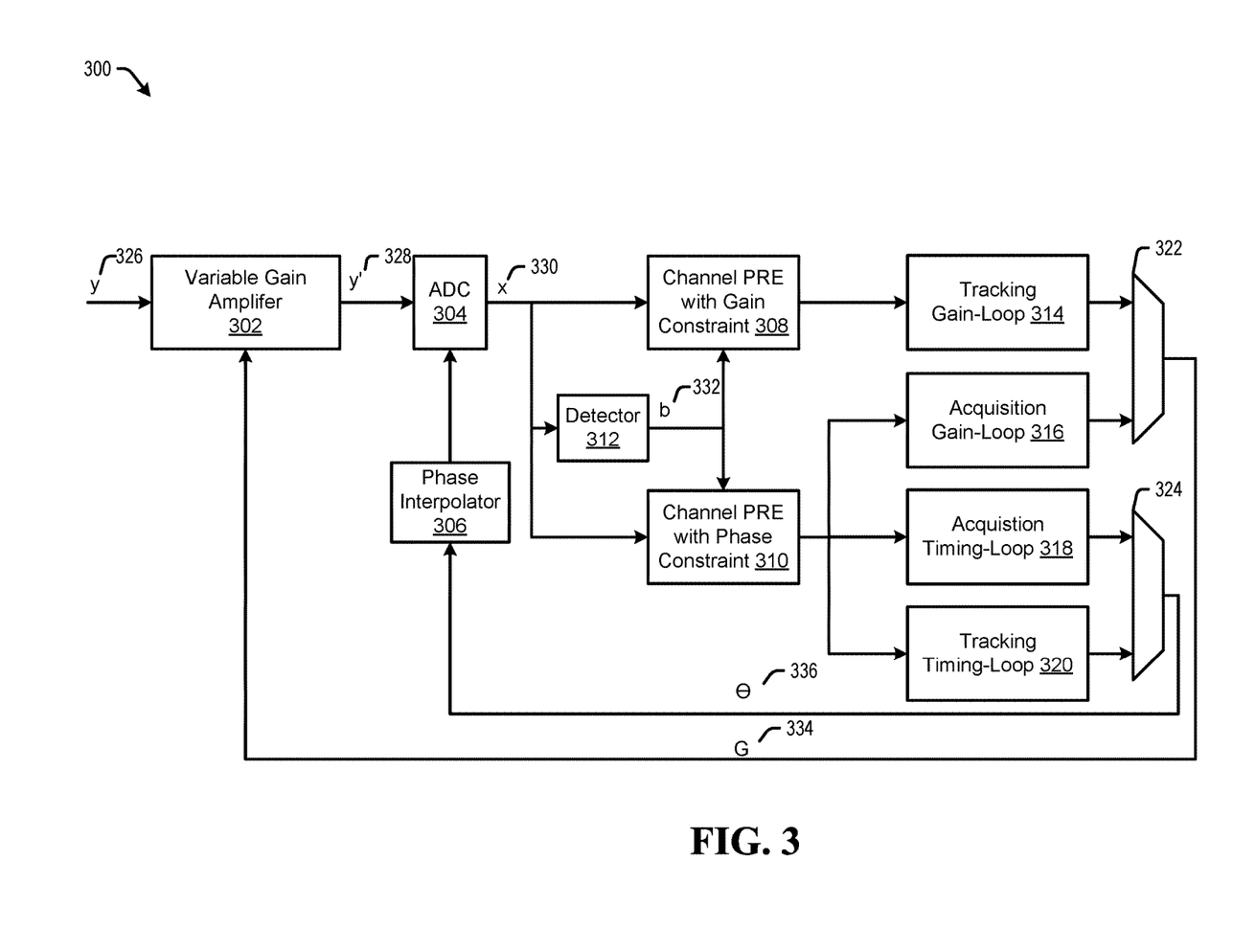
FIG. 3 is a block diagram illustrating an embodiment of a recording system which may utilize multiple channel pulse response estimates during acquisition and tracking for adjustments of ADC parameters, in accordance with certain embodiments of the present disclosure.

FIG. 3 is a block diagram illustrating an embodiment of a recording system 300 which may utilize multiple channel pulse response estimates during acquisition and tracking for adjustments of ADC parameters. System 300 can include a variable gain amplifier (VGA) 302 that may be coupled to an analog-to-digital converter (ADC) 304. System 300 may further include a phase interpolator 306 that may be coupled to the ADC 304. The ADC 304 may be coupled to a channel pulse response estimate circuit with a gain constraint (PRE$_G$) 308, a channel pulse response estimate circuit with a phase constraint (PRE$_\theta$) 310, and a low latency detector 312. The PRE$_G$ 308 may be coupled to a tracking gain-loop 314 and the PRE$_\theta$ 310 may be coupled to an acquisition gain-loop 316, an acquisition timing-loop 318 and a tracking timing-loop 320. The low latency detector 312 may be coupled to the PRE$_G$ 308 and the PRE$_\theta$ 310. The acquisition gain-loop 316 and the tracking gain-loop 314 may be coupled to the multiplexer (MUX) 322 and the acquisition timing-loop 318 and the tracking timing-loop 320 may be coupled to the MUX 324. The MUX 322 may be coupled to the VGA 302 and the MUX 324 may be coupled to the phase interpolator 306.

Each of the VGA 302, ADC 304, phase interpolator 306, PRE$_G$ 308, PRE$_\theta$ 310, low latency detector 312, acquisition gain-loop 316, tracking gain-loop 314, acquisition timing-loop 318, tracking timing-loop 320, MUX 322 and MUX 324 may be a separate circuit, a system on chip (SOC), firmware, a processor(s), or other system not listed, or any combination thereof. For example, the VGA 302 and the phase interpolator 306 may be included within an AFE, the ADC 304, another circuit or may be independent circuits.

In operation, the VGA 302 may receive a continuous-time signal y 326. The VGA 302 may apply a gain to the continuous-time signal y 326 to generate a gain compensated continuous-time signal y' 328. The VGA 302 may then output the gain compensated continuous-time signal y' 328 to the ADC 304. As mentioned above, the VGA 302 may apply the gain to scale the signal range at the input of ADC 304. In some examples, the VGA 302 may be configured to scale the signal range at the input of ADC 304 to maximize the utilization of the range of ADC 304. It should be noted that in some examples, the VGA 302 and ADC 304 may not be connected directly. For example, other AFE circuits may be between the VGA and ADC, such as offset compensation, filters etc.

The ADC 304 may receive the gain compensated continuous-time signal y' 328 and may sample the signal y' 328 at time intervals according to a sampling clock of the ADC 304. The ADC 304 may quantize the samples of the signal y' 328 to produce a digitized sequence of samples x 330. The ADC 304 may output the samples x 330 to the PRE$_G$ 308, the PRE$_\theta$ 310, and the low latency detector 312.

Generally, PRE$_G$ 308 and the PRE$_\theta$ 310 each may generate respective estimated signals $\hat{x}^p$ and $\hat{x}^h$ based on respective channel pulse responses p and h (e.g., of a wireless communications or storage device read channel) based on the ADC samples x 330 and decisions b 332 made using the low-latency detector 312. In various embodiments, the low-latency detector 312 may be implemented using any appropriate detector, such as a Viterbi-Detector, a slicer, or a decision feedback equalizer.

During the preamble 202, the acquisition gain-loop 316 and acquisition timing-loop 318 may determine and output a gain adjustment to the MUX 322 and a phase adjustment to the MUX 324. In some examples, the acquisition gain-loop 316 and acquisition timing-loop 318 may determine the respective adjustments based on an amplitude target A$_T$ and a phase target $\theta_T$ which may be determined based on the estimated signal $\hat{x}^h$ from the PRE$_\theta$ 310 (e.g. based on a known preamble pattern).

During the user data 204, the tracking gain-loop 314 and the tracking timing-loop 320 may output adjustments. For example, the tracking timing-loop 320 may determine a phase adjustment based on a comparison of the ADC samples x 330 and an estimated signal $\hat{x}^h$ from the PRE$_\theta$ 310. The tracking gain-loop 314 may determine a gain adjustment based on a comparison of the ADC samples x 330 and an estimated signal $\hat{x}^p$ from the PRE$_G$ 308.

As mentioned above, the PRE$_G$ 308 may have a gain constraint. As such, the PRE$_G$ 308 may distort the estimated channel pulse-response such that it may represent a channel pulse-response p with a desired signal amplitude. In some embodiments, the estimated channel pulse response p of the PRE$_G$ may be distorted by constraining a parameter (e.g. a center tap) to a certain value. In doing so, an error computed by tracking gain-loop 314 may reflect this distortion and, by extension, this distortion may affect the adjustment of the gain applied by the VGA 302.

The PRE$_\theta$ 310 may have a phase constraint. As such, the PRE$_\theta$ 310 may distort the estimated channel pulse-response such that it may represent a pulse-response h with a desired signal phase. In some embodiments, the estimated channel pulse response of the PRE$_\theta$ 310 may be distorted by constraining the pulse response phase with a symmetric constraint (e.g. $h_i = h_{-i}$, i=1, 2, 3). In doing so, an error computed by timing-loops 318 and 320 may reflect this distortion and, by extension, this distortion may affect the adjustment of the sampling phase of the ADC determined by the phase interpolator 306.

The MUX 322 may operate to select a gain adjustment output by the acquisition gain-loop 316 during the preamble 202 and select a gain adjustment output by the tracking gain-loop 314 during the user data 204. The selected gain adjustment may then be output to the VGA 302 as gain adjustment 334. Similarly, the MUX 324 may operate to select a phase adjustment output by the acquisition timing-loop 318 during the preamble 202 and select a phase adjustment output by the tracking timing-loop 320 during the user data 204. The selected phase adjustment may then be output to the phase interpolator 306 as phase adjustment 336.

Additional details of the determination of the channel pulse-responses p and h, the amplitude target A$_T$ and phase target $\theta_T$, and the gain adjustments and phase adjustments are discussed in more detail below with respect to FIGS. 4 and 5.

Figure 4:
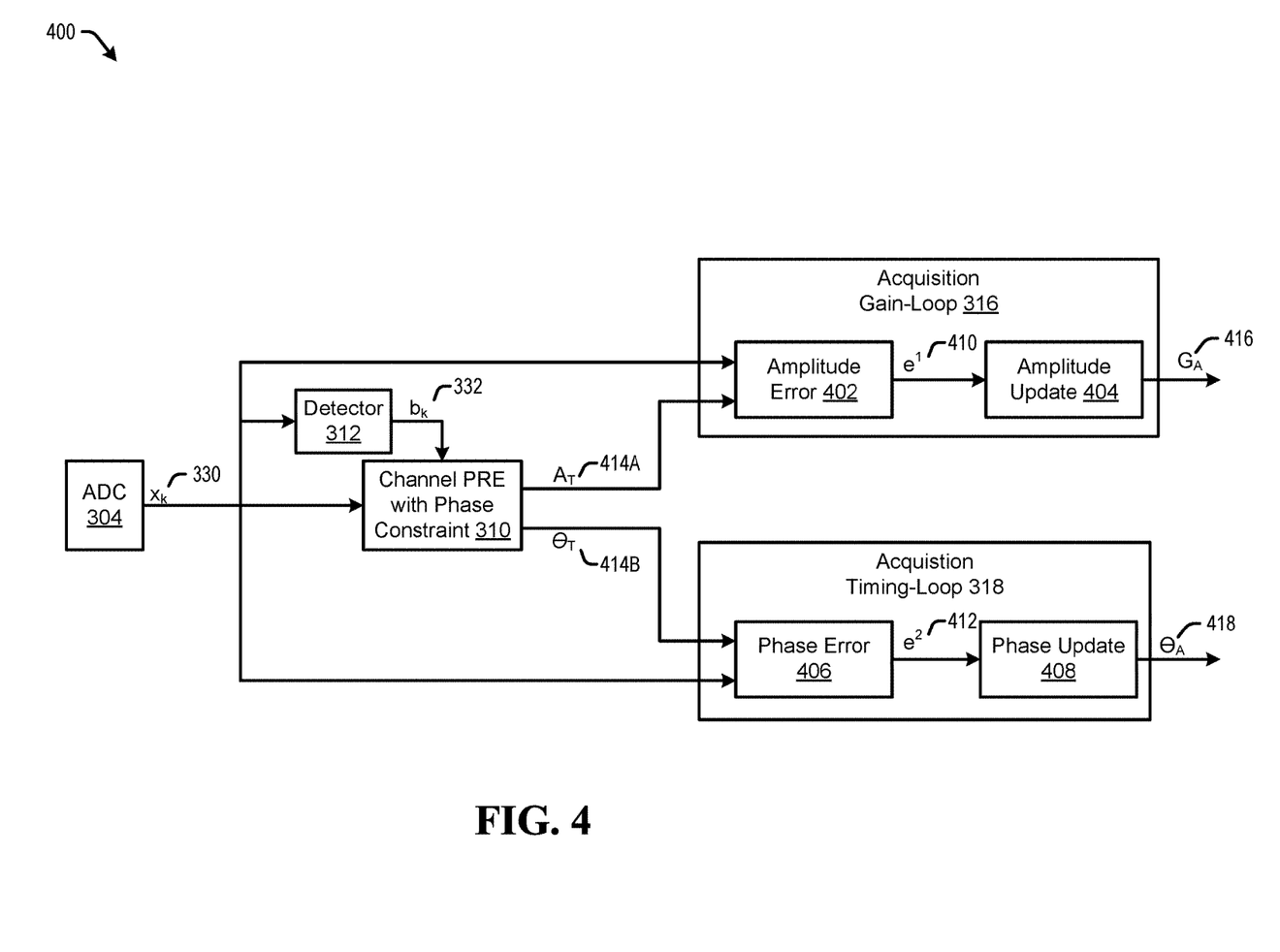
FIG. 4 is a block diagram illustrating the operation of the system of FIG. 3 during acquisition, in accordance with certain embodiments of the present disclosure.

FIG. 4 is a block diagram 400 illustrating the operation of system 300 during acquisition (e.g. during the preamble 202).

As mentioned above, the PRE$_\theta$ 310 may generate an estimated signal $\hat{x}_k^h$ based on a channel pulse response estimate h. During acquisition, instead of using the detected decisions, known patterns may be used, which may make estimating the amplitude and phase of the signal easier. In the examples discussed below, the estimated signal $\hat{x}_k^h$ may be determined for a pulse response of 7 taps, for a 4T-preamble pattern. For other preamble patterns and pulse response length, similar procedures can be followed.

In the following discussion, a phase constrained or unconstrained pulse response may be represented as $\{h_{-3}, h_{-2}, h_{-1}, h_0, h_1, h_2, h_3\}$.

In some examples, the estimated signal $\hat{x}_k^h$ may be computed from the known bit patterns and the pulse response h using in the following table:

| Signal | $b_{k-3}b_{k-2}b_{k-1}b_kb_{k+1}b_{k+2}b_{k+3}$ | Computation |
|---|---|---|
| $\hat{x}_0$ | 1, 0, 0, 1, 1, 0, 0 | $-h_{-3} - h_{-2} + h_{-1} + h_0 - h_1 - h_2 + h_3$ |
| $\hat{x}_1$ | 0, 0, 1, 1, 0, 0, 1 | $h_{-3} - h_{-2} - h_{-1} + h_0 + h_1 - h_2 - h_3$ |
| $\hat{x}_2$ | 0, 1, 1, 0, 0, 1, 1 | $h_{-3} + h_{-2} - h_{-1} - h_0 + h_1 + h_2 - h_3$ |
| $\hat{x}_3$ | 1, 1, 0, 0, 1, 1, 0 | $-h_{-3} + h_{-2} + h_{-1} - h_0 - h_1 + h_2 + h_3$ |

As mentioned above, the amplitude target $A_T$ 414A and the phase target $\theta_T$ 414B may be determined during the preamble.

From the estimated signal samples $\hat{x}_k^h$, the $PRE_\theta$ 310 may determine an amplitude target $A_T$ 414A based on the following equation:

$$A_T = \frac{1}{2}\sqrt{(\hat{x}_0 - \hat{x}_2)^2 + (\hat{x}_1 - \hat{x}_3)^2}$$

Similarly, from the estimated signal samples $\hat{x}_k^h$, the $PRE_\theta$ 310 may determine a phase target $\theta_T$ 414B based on the following equation:

$$\theta_T = \tan^{-1}\frac{\hat{x}_0 - \hat{x}_2}{\hat{x}_1 - \hat{x}_3}$$

The $PRE_\theta$ 310 may output the amplitude target $A_T$ 414A and estimated signals phase target $\theta_T$ 414B to the acquisition gain-loop 316 and the acquisition timing-loop 318, respectively.

The acquisition gain-loop 316 may include an amplitude error circuit 402 and an amplitude update circuit 404.

The amplitude error circuit 402 may determine the amplitude A of the ADC samples $\{x_k\}$ based on the following equation, where $x_0$, $x_1$, $x_2$, $x_3$ are four samples in one 4T clock cycle:

$$A = \frac{1}{2}\sqrt{(x_0 - x_2)^2 + (x_1 - x_3)^2}$$

The amplitude error circuit 402 may then determine an amplitude error $e^1$ 410 as the difference of the amplitude target $A_T$ 414A and the amplitude A of the ADC samples $\{x_k\}$ using the following equation:

$$e^1 = A_T - A$$

The amplitude update circuit 404 may determine an acquisition gain adjustment $G_A$ 416. For example, the amplitude update circuit 404 may determine the acquisition gain adjustment $G_A$ 416 using, for example, the following update equation:

$$G(t+1) = G(t) - \mu_G e^1$$

where G is the gain value, $e^1$ 410 is the amplitude error between the amplitude target $A_T$ 414A and the amplitude A of the ADC samples at time t controls the speed of adaptation. Depending on the implementation, the output of the amplitude update 404 may be an adjustment (e.g., a change to be applied to the gain applied by the VGA 302) or the gain value to be utilized by the VGA 302.

The phase error circuit 406 may determine the phase $\theta$ of the ADC samples $\{x_k\}$ based on the following equation, where $x_0$, $x_1$, $x_2$, $x_3$ are four samples in one 4T clock cycle:

$$\theta = \tan^{-1}\frac{x_0 - x_2}{x_1 - x_3}$$

The phase error circuit 406 may determine a phase error $e^2$ 412 as the difference of the phase target $\theta_T$ 414B and the phase $\theta$ of the ADC samples $\{x_k\}$. using the following equation:

$$e^2 = \theta_T - \theta$$

The phase update circuit 408 may determine an acquisition phase adjustment $\theta_A$ 418. For example, the phase update circuit 408 may determine the acquisition phase adjustment $\theta_A$ 418 based on the phase error $e^2$ 412 In some examples, the phase error $e^2$ 412 in acquisition may be averaged over multiple samples, and this average may be regarded as an estimation of the difference between current signal phase and the intended phase. This average may be used as the phase adjustment $\theta_A$ 418.

The acquisition operations described above may be performed a predetermined number of times, until convergence, or etc. For example, in some embodiments, the acquisition operations may be performed for ten (10) sets of four (4) ADC samples x. In addition, in some examples, the PREs 308 and 310 may be configured to disable adaptation of the PRE taps during acquisition. In addition, in some examples, the amplitude target $A_T$ 414A and the phase target $\theta_T$ 414B may be calculated once for each sector.

Figure 5:
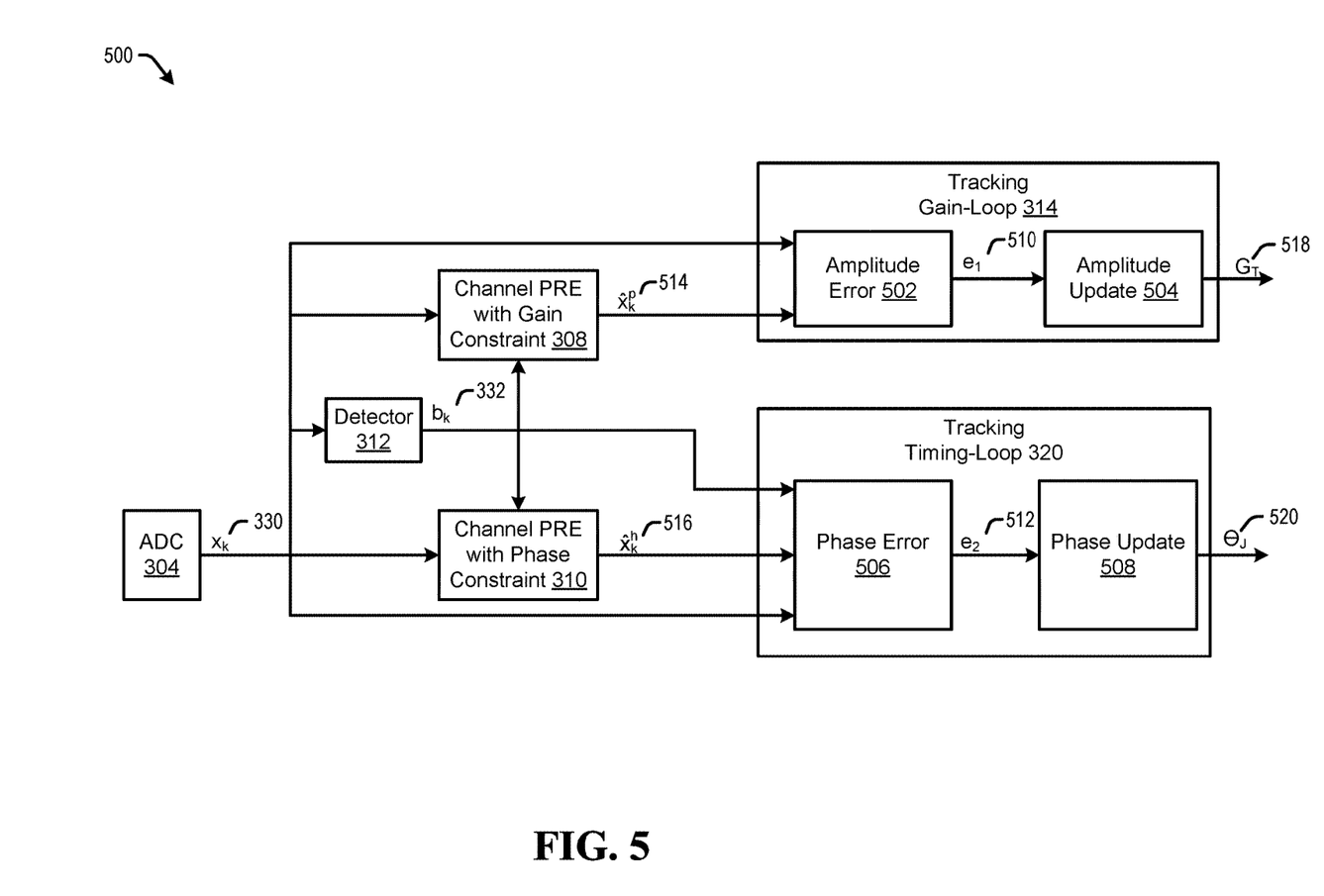
FIG. 5 is a block diagram illustrating the operation of system of FIG. 3 during tracking, in accordance with certain embodiments of the present disclosure.

FIG. 5 is a block diagram 500 illustrating the operation of system 300 during tracking (e.g. during the user data 204).

The $PRE_\theta$ 310 may continue to generate an estimated signal $\hat{x}_k^h$ based on a channel pulse response estimate h and decisions b 332 and the $PRE_G$ 308 may generate an estimated signal $\hat{x}_k^p$ based on a channel pulse response estimate p and decisions b 332. In the examples discussed below, the estimated signals may be determined for pulse responses of 7 taps. As such, the phase constrained or unconstrained pulse response h of $PRE_\theta$ 310 may be represented as $\{h_{-3}, h_{-2}, h_{-1}, h_0, h_1, h_2, h_3\}$ and a gain constrained pulse response p of $PRE_G$ 308 may be represented as $\{p_{-3}, p_{-2}, p_{-1}, p_0, p_1, p_2, p_3\}$. For other pulse response lengths, similar procedures can be followed.

During the tracking stage, the estimated signal $\hat{x}_k^p$ 514 may be estimated using the estimated channel pulse response p of the $PRE_G$ 308 (e.g. $\{i=-L_1, \ldots, -1, 0, 1, \ldots, L_2\}$) and the detected data bits b 332 based on the following equation:

$$\hat{x}_k^p = \sum_{i=-L_1}^{L_2} p_i b_{k-i}$$

The $PRE_G$ 308 may output the estimated signals $\hat{x}_k^p$ 514 to the tracking gain-loop 314.

Similarly, during the tracking stage, the estimated signal $\hat{x}_k^h$ 516 may be estimated using the estimated channel pulse response h of the $PRE_\theta$ 310 (e.g. $\{h_i, i=-L_1, \beta, -1, 0, 1, \ldots, L_2\}$) and the detected data bits b 332 based on the following equation:

$$\hat{x}_k^h = \sum_{i=-L_1}^{L_2} h_i b_{k-i}$$

The PRE$_\theta$ 310 may output the estimated signals $\hat{x}_k^h$ 516 to the tracking timing-loop 320. It may also provide the estimated signals for other loops, such as offset loop or MRA loop.

The tracking gain-loop 314 may be configured to determine a gain adjustment which may enable the signal $x_k$ 318 to maximize the utilization of the range of ADC, which may result in a better bit error rate (BER).

In some examples, the tracking gain-loop 314 may compute the tracking gain adjustment G$_T$ 518 based on the signal estimation from the channel pulse response $\hat{x}_k^P$. More particularly, in some embodiments, the tracking gain adjustment G$_T$ 518 may be based on the error $e_k$ between the incoming signal $x_k$ and the estimated signal $\hat{x}_k^P$ and may be computed by the amplitude error circuit 502 based on the following equation:

$$e_k = x_k - \hat{x}_k^P$$

The error may be output by the amplitude error circuit 502 to the amplitude update circuit 504 as error $e^1$ 510.

The amplitude update circuit 504 may determine the tracking gain adjustment G$_T$ 518. For example, the amplitude update circuit 504 may determine the tracking gain adjustment G$_T$ 518 based on the error $e^1$ 510 using a least means square (LMS) update.

In operation, an approximation of the LMS update equations can be written as:

$$G(t+1) = G(t) - \mu_G e_k \, \text{sign}(x_k)$$

where G is the gain value, $e_k$ is the error $e^1$ 510 b, $x_k$ is the ADC samples, $\mu_G$ controls the speed of adaptation, and $$\text{sign}(x) = \begin{cases} 1 & x > 0 \\ 0 & x = 0 \\ -1 & x < 0 \end{cases}$$

The tracking timing-loop 320 may be configured to determine a phase adjustment $\theta_j$ which may adjust the sampling clock phase such that the sampling clock phase does not drift during the user data 204 due to phase variation in the input signal.

In some examples, the tracking timing-loop 320 may compute the tracking phase adjustment $\theta_j$ 520 based on the signal estimation from the channel pulse response $\hat{x}_k^P$. More particularly, in some embodiments, the tracking phase adjustment $\theta_H$ 520 may be based on the signal error $e_k$ between the incoming signal $x_k$ and the estimated signal $\hat{x}_k^h$.

The phase error may be output by the phase error circuit 506 to the phase update circuit 508 as error $e_2$ 512.

The phase update circuit 508 may determine the tracking phase adjustment $\theta_j$ 520. For example, the phase update circuit 508 may determine the tracking phase adjustment $\theta_j$ 520 based on the phase error $e^2$ 512 through a phase lock loop with a loop filter.

During tracking (e.g. during the user data 204), the tap values of the PRE$_G$ 308 and the PRE$_\theta$ 310 may be adapted. For example, the PREs may be adapted using LMS updates. In general, the LMS update equations for taps of an unconstrained PRE may be written as:

$$h_i(t+1) = h_i(t) + \mu e_k b_{k-i},$$

where $e_k$ is the error between the incoming signal and the estimated signal output by the PRE, $b_k$ is the decision by the detector, and $\mu$ is the adaptation bandwidth control.

In the case of constrained PREs, such as PREs in which some taps may be fixed or in which some taps have fixed relationships, the update equation for particular taps may vary. For example, if the maximum estimated signal magnitude of a 7-tap PRE is constrained to be a fixed value M$_x$, the update of taps may performed using the following equations:

$$p_i(t+1) = p_i(t) + \mu e_k b_{k-i}, \, i = -3, -2, -1, 1, 2, 3$$

$$p_0(t+1) = M_x - \sum_{i=-3, i \neq 0}^{i=3} |p_i(t+1)|$$

Similarly, if a 7-tap PRE has a symmetric constraint, the update of taps may performed using the following equations:

$$h_i(t+1) = h_i(t) + \mu e_k b_{k-i}, \, i = 0$$

$$h_j(t+1) = h_{-j}(t+1) = h_j(t) + \mu e_k (b_{k-j} + b_{k+j}), \, j = 1, 2, 3$$

Other variations and constraints are possible.

By adapting the PRE$_\theta$ 310 (e.g., a PRE without a gain constraint) during the user data 204 in which the VGA 302 is being adjusted based on the output of the gain constrained PRE$_G$ 308, the system 300 may avoid the LMS adaptation driving the signal to zero. While an all-zero solution may be a valid solution to the least squared error equation, the all-zero solution may not be a valid solution in operation.

In some examples according to the above disclosure, more consistency between acquisition and tracking may result from the utilization of PRE$_G$ 308 and PRE$_\theta$ 310. The improved consistency may result in a reduced transient period for convergence of the gain and phase between the preamble 202 and user data 204.

Figure 6:
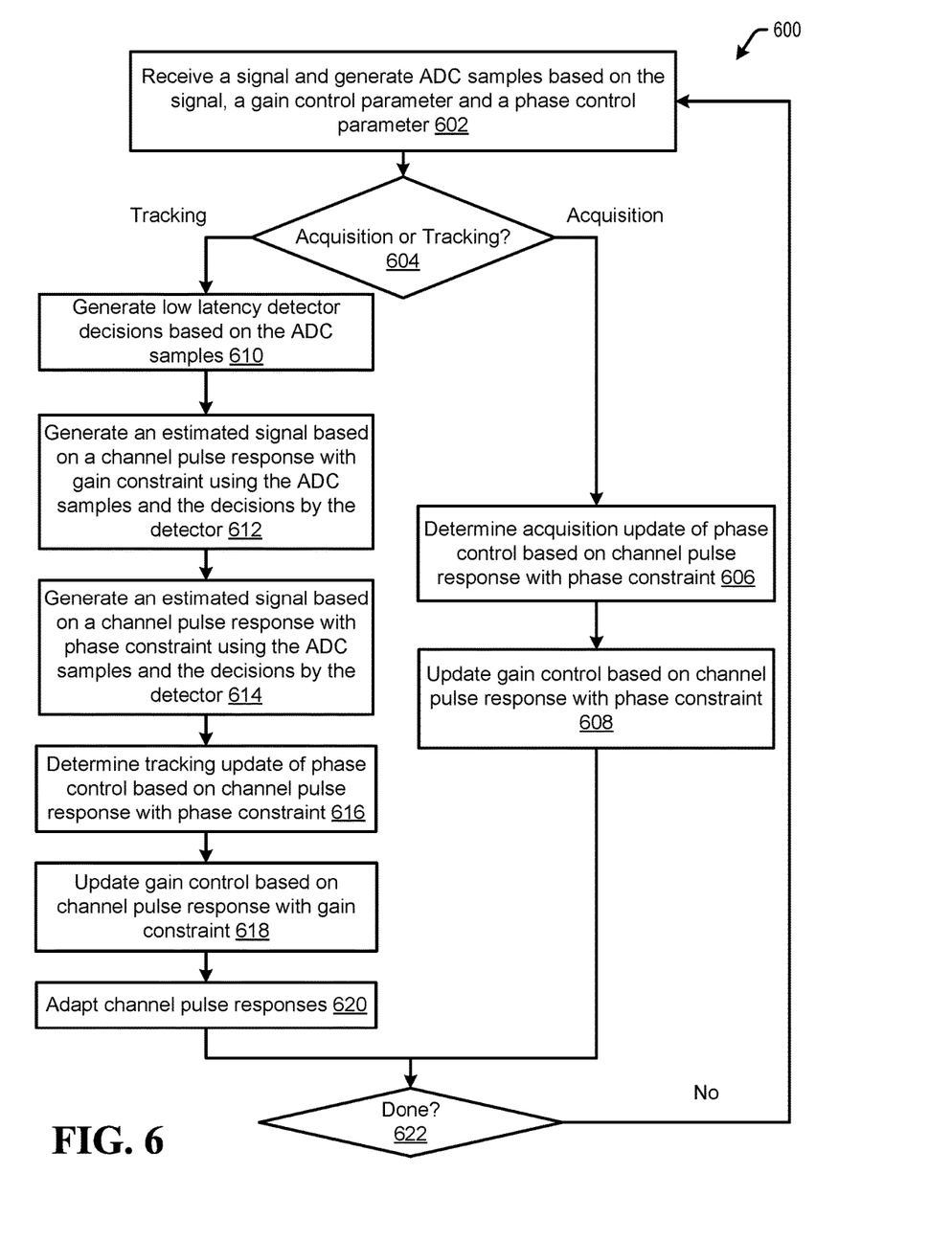
FIG. 6 is a flowchart of a method of adjusting ADC parameters during acquisition and tracking that based on multiple channel pulse response estimates, in accordance with certain embodiments of the present disclosure.

Referring to FIG. 6, a flowchart of a method for adjusting ADC parameters during acquisition and tracking that based on multiple channel pulse response estimates is shown and is generally designated 600. The method 600 can be an embodiment of the systems 100-500 and the operations of method 600 may be performed as detailed above with respect to FIGS. 1-5.

At 602, a VGA may receive an input signal. The VGA may apply a gain to the input signal to generate a gain adjusted signal and output the gain adjusted signal to an ADC. The ADC may then generate and output ADC samples based on the gain adjusted signal and a phase control parameter which may control a phase of a sampling clock of the ADC.

Next, at 604, the system may determine whether the ADC samples are based on preamble or user data of the incoming signal. If the ADC samples are based on a preamble portion of the incoming signal, the process may continue to 606. If the ADC samples are based on user data of the incoming signal, the process may continue to 610.

At 606, the system may update the phase control parameter based the channel pulse response h with the phase constraint. In some examples, the update determination may be performed as discussed above for phase control updates in preamble or acquisition.

At 608, the system may update the gain control parameter based on the channel pulse response h with the phase constraint. In some examples, the update determination may be performed as discussed above for gain control updates in the preamble or acquisition.

At 610, a low latency detector may receive the ADC samples. The detector may then generate and output decisions based on the ADC samples. At 612, the system may generate an estimated signal $\hat{x}_k^p$ based on a channel pulse response estimate p with a gain constraint using the ADC samples and the decisions by the detector. Then, at 614, the system may generate an estimated signal $\hat{x}_k^h$ based on a channel pulse response estimate h with a phase constraint using the ADC samples and the decisions by the detector.

At 616, the system may update the phase control parameter based on the estimated signal $\hat{x}_k^h$ which was generated based on the channel pulse response h with the phase constraint. In some examples, the update determination may be determined as discussed above for phase control updates in the user data or tracking.

At 618, the system may update the gain control parameter based on the estimated signal $\hat{x}_k^p$ which was generated based on the channel pulse response p with the gain constraint. In some examples, the update determination may be performed as discussed above for gain control updates in the user data or tracking. Then, at 620, the taps of the channel pulse responses may be adapted.

Following 608 or 620, the process continues to 622. At 622, the system may determine whether processing of the incoming signal is complete. If so, the process ends. Otherwise, the process returns to 602 for another iteration based on the updated gain and phase control parameters determined at 606-6620.

All steps listed for the method 600 may be applied to systems that have an acquisition and tracking system for amplitude and phase. Many variations would be apparent in view of this disclosure. Components and circuits used to perform the operations in the method may be discrete, integrated into a system on chip (SOC), or other circuits. Further, the steps can be carried out in a processor (e.g. a digital signal processor), implemented in software, implemented via firmware, or by other means.

Figure 7:
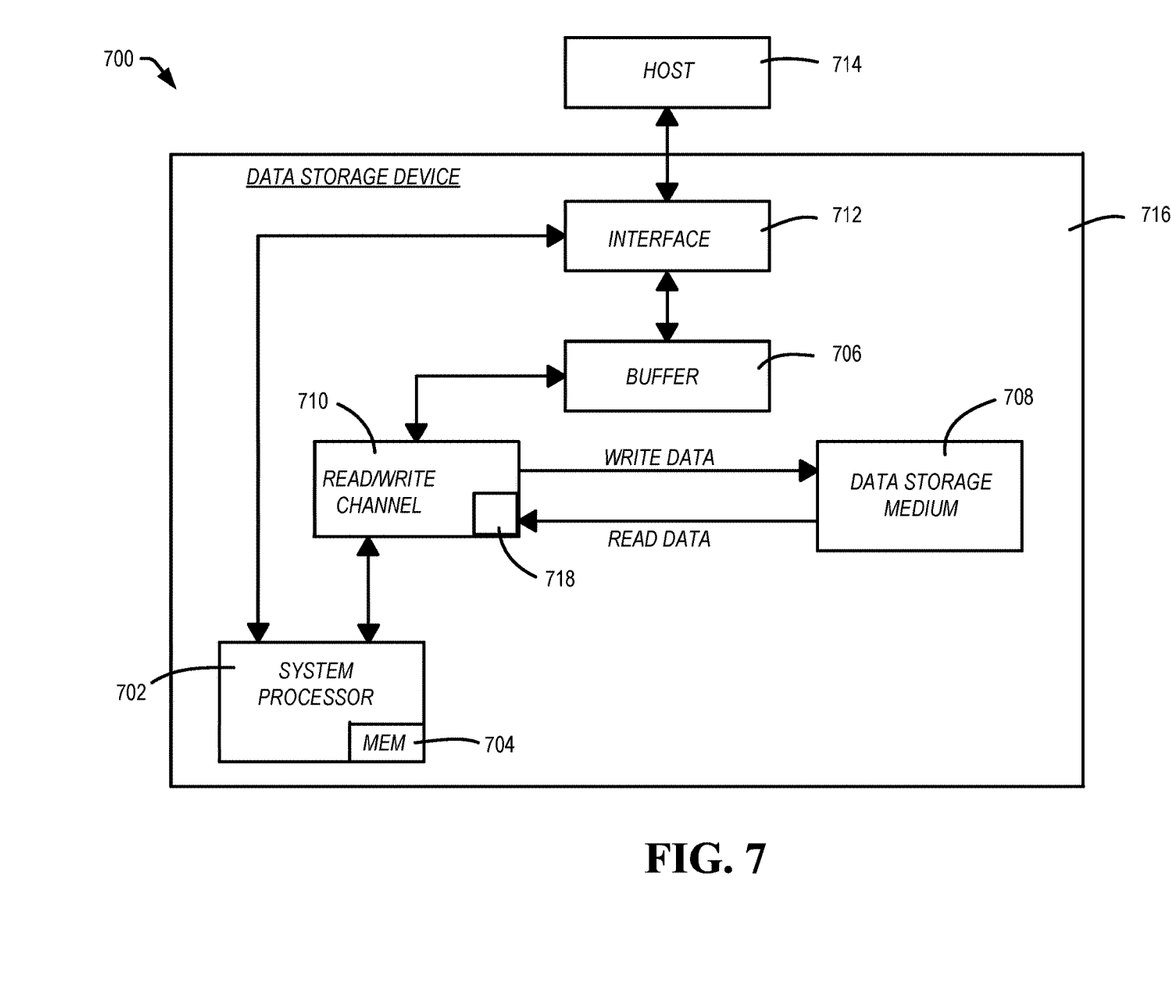
FIG. 7 is a block diagram of a system including may utilize multiple channel pulse response estimates for acquisition and tracking, in accordance with certain embodiments of the present disclosure.

Referring to FIG. 7, a block diagram of a system including target parameter adaptation is shown and generally designated 700. The system 700 can be an example of a data storage device (DSD), and may be an example implementation of systems or methods 100-600. The DSD 716 can optionally connect to and be removable from a host device 714, which can be a device or system having stored data, such as a desktop computer, a laptop computer, a server, a digital video recorder, a photocopier, a telephone, a music player, other electronic devices or systems not listed, or any combination thereof. The data storage device 716 can communicate with the host device 714 via the hardware/firmware based host interface circuit 712 that may include a connector (not shown) that allows the DSD 716 to be physically connected and disconnected from the host 714.

The DSD 716 can include a system processor 702, which may be a programmable controller, and associated memory 704. The system processor 702 may be part of a system on chip (SOC). A buffer 706 may temporarily store data during read and write operations and can include a command queue. The read/write (R/W) channel 710 can encode data during write operations to, and reconstruct data during read operations from, the data storage medium 708. The data storage medium 708 is shown and described as a hard disc drive, but may be other types of magnetic medium, such as a flash medium, optical medium, or other medium, or any combination thereof.

The R/W channel 710 may receive data from more than one data storage medium at a time, and in some embodiments can also receive multiple data signals concurrently, such as from more than one output of a read head. For example, storage systems having two-dimensional magnetic recording (TDMR) systems can have multiple reading or recording elements, and can read from two tracks simultaneously or nearly simultaneously. Multi-dimensional recording (MDR) systems can receive two or more inputs from multiple sources (e.g. recording heads, flash memory, optical memory, and so forth). The R/W channel 710 can combine multiple inputs and provide a single output, as described in examples herein.

The block 718 can implement all of or part of the systems and functionality of systems and methods 100-600. In some embodiments, the block 718 may be a separate circuit, integrated into the R/W channel 710, included in a system on chip, firmware, software, or any combination thereof.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, the figures and above description provide examples of architecture and voltages that may be varied, such as for design requirements of a system. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a magnetic disc storage medium;
   a read head;
   a preamplifier configured to be connected to the read head, wherein the read head is configured to read data from the magnetic disc storage medium, the preamplifier further configured to:
      receive a read signal from the head including the read data from the read head; and
      apply a signal processing to the read signal to generate an input signal, the signal processing including at least amplifying the read signal; and
   a circuit configured to:
      generate, by an analog to digital converter (ADC), one or more ADC samples based at least in part on the input signal;
      generate a first estimated signal using a first channel pulse response estimation with a gain constraint based on the one or more ADC samples; and
      generate a second estimated signal using a second channel pulse response estimation with a phase constraint based on the one or more ADC samples.

2. The apparatus of claim 1, further comprising the circuit further configured to:

determine a gain control parameter value for a variable gain amplifier (VGA) generating the input signal based on the second estimated signal.

3. The apparatus of claim 2, further comprising the circuit further configured to:
determine a phase control parameter value for a sampling clock of the ADC based on the second estimated signal; and
determine another gain control parameter for the VGA generating the input signal based on the first estimated signal.

4. The apparatus of claim 3, further comprising the circuit further configured to:
determine the gain control parameter for a preamble portion of the input signal; and
determine the other gain control parameter for a user data portion of the input signal.

5. The apparatus of claim 4, further comprising the circuit further configured to:
adapt the parameters of the second channel pulse response estimation with the phase constraint during the user data portion of the input signal; and
halt adaptation of the parameters of the second channel pulse response estimation with the phase constraint during the preamble portion of the input signal.

6. The apparatus of claim 1 further comprising the circuit further configured to perform the generation of the second estimated signal using the second channel pulse response estimation with the phase constraint based on the one or more ADC samples by:
generating one or more detector decisions based on the one or more ADC samples; and
generating the second estimated signal based on the second channel pulse response estimation with the phase constraint and the detector decisions.

7. The apparatus of claim 6, further comprising the circuit further configured to:
determine an amplitude target based on the second estimated signal;
determine an amplitude based on the one or more ADC samples;
determine an amplitude error based on the amplitude target and the amplitude; and
determine, during a preamble, a gain control parameter for a variable gain amplifier (VGA) generating the input signal based on the amplitude error.

8. The apparatus of claim 1, further comprising the gain constraint being a constraint on a tap value of the center tap of a first channel pulse response estimation.

9. The apparatus of claim 1, further comprising the phase constraint being a symmetric constraint on tap values of one or more taps of the second channel pulse response estimation.

10. A system comprising:
a magnetic disc storage medium;
a read head;
a preamplifier configured to be connected to the read head, wherein the read head is configured to read data from the magnetic disc storage medium, the preamplifier further configured to:
receive a read signal from the head including the read data from the read head; and
apply a signal processing to the read signal to generate an input signal, the signal processing including at least amplifying the read signal; and
an ADC circuit configured to generate one or more ADC samples based on an input signal from the read head;

a first channel pulse response estimate circuit configured to generate a first estimated signal using a first channel pulse response estimation with a gain constraint based on the one or more ADC samples; and
a second channel pulse response estimate circuit configured to generate a second estimated signal using a second channel pulse response estimation with a phase constraint based on the one or more ADC samples.

11. The system of claim 10 further comprising:
a variable gain amplifier (VGA) configured to:
receive a VGA input signal;
generate the input signal by applying a gain to the VGA input signal; and
a detector configured to generate one or more detector decisions based on the one or more ADC samples.

12. The system of claim 11 further comprising the first channel pulse response estimate circuit configured to perform the generation of the first estimated signal using the first channel pulse response estimation with the gain constraint based on the one or more ADC samples by:
generating the first estimated signal based on the first channel pulse response estimation with the gain constraint and the detector decisions.

13. The system of claim 11 further comprising:
an acquisition gain-loop circuit configured to:
determine an amplitude target based on the second estimated signal;
determine an amplitude based on the one or more ADC samples;
determine an amplitude error based on the amplitude target and the amplitude; and
determine, during a preamble portion, a gain control parameter for the variable gain amplifier (VGA) generating the input signal based on the amplitude error.

14. The system of claim 10 further comprising the second channel pulse response estimate circuit further configured to:
adapt parameters of the second channel pulse response estimation with the phase constraint during a user data portion of the input signal; and
halt adaptation of the parameters of the second channel pulse response estimation with the phase constraint during a preamble portion of the input signal.

15. The system of claim 10 further comprising the phase constraint being a symmetric constraint on tap values of one or more taps of the second channel pulse response estimation.

16. The system of claim 10 further comprising the gain constraint being a constraint on a tap value of a center tap of the first channel pulse response estimation.

17. A method comprising:
reading, by a read head, read data from a magnetic disc storage medium to generate an read signal;
generating by a preamplifier, an input signal by applying a signal processing to the read signal including at least amplifying,
generating, by an analog to digital converter (ADC), one or more ADC samples based on the input signal;
generating a first estimated signal using a first channel pulse response estimation with a gain constraint based on the one or more ADC samples;
generating a second estimated signal using a second channel pulse response estimation with a phase constraint based on the one or more ADC samples; and during a preamble portion of the input signal, determining a gain control parameter for a variable gain amplifier (VGA) generating the input signal based on the second estimated signal.

18. The method of claim 17 further comprising:

determining a phase control parameter for a sampling clock of the ADC based on the first estimated signal; and during a user data portion of the input signal, determining another gain control parameter for the VGA generating the input signal based on the first estimated signal.

19. The method of claim 18 further comprising:

adapting the parameters of the second channel pulse response estimation with the phase constraint during the user data portion of the input signal; and halting adaptation of the parameters of the second channel pulse response estimation with the phase constraint during the preamble portion of the input signal.

20. The method of claim 17 further comprising:

determining an amplitude target based on the second estimated signal;

determining an amplitude based on the one or more ADC samples; and determining an amplitude error based on the amplitude target and the amplitude; and the method further including:

performing the generation of the second estimated signal using the second channel pulse response estimation by:

generating one or more detector decisions based on the one or more ADC samples; and generating the second estimated signal based on the second channel pulse response estimation with the phase constraint and the detector decisions; and performing the determining, during the preamble portion, of the gain control parameter for the variable gain amplifier (VGA) generating the input signal based on the amplitude error.

* * * * *